(12) United States Patent
Chen et al.

(10) Patent No.: US 7,991,102 B2
(45) Date of Patent: Aug. 2, 2011

(54) SIGNAL GENERATING APPARATUS AND METHOD THEREOF

(75) Inventors: Hsin-Hung Chen, Miaoli County (TW); Ling-Wei Ke, Hsin-Chu Hsien (TW); Tai-Yuan Yu, Taoyuan County (TW); Tser-Yu Lin, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 698 days.

(21) Appl. No.: 11/858,886

(22) Filed: Sep. 20, 2007

(65) Prior Publication Data

US 2009/0080563 A1 Mar. 26, 2009

(51) Int. Cl.
*H03D 3/24* (2006.01)
(52) U.S. Cl. ........................................... 375/376
(58) Field of Classification Search ............... 375/376
See application file for complete search history.

(56) References Cited

U.S. PATENT DOCUMENTS

| | | | |
|---|---|---|---|
| 6,724,265 B2 | 4/2004 | Humphreys | |
| 2005/0185749 A1* | 8/2005 | Convent et al. | 375/376 |
| 2006/0088126 A1* | 4/2006 | Puma | 375/302 |
| 2007/0146083 A1* | 6/2007 | Hein et al. | 331/16 |

OTHER PUBLICATIONS

McMahill, "Automatic calibration of modulated fractional-N frequency synthesizer", MIT 2001 section 2.4-2.5 p. 30-32 (see dspace.mit.edu/bitstream/handle/1721.1/16780/ 49545342.pdf?*
Akamine, "A loop-bandwidth calibration system for fractional-N synthesizer and $\Delta\Sigma$-PLL transmitter", Digest of Technical Papers, ISSCC. 2005 IEEE International Solid-State Circuits Conference, 2005, Publication Year: 2005 , pp. 314-600 vol. 1.*

* cited by examiner

*Primary Examiner* — Juan A Torres
(74) *Attorney, Agent, or Firm* — Winston Hsu; Scott Margo

(57) ABSTRACT

A signal generating apparatus includes: a test data generator for generating a test data; a fractional-N phase-locked loop device coupled to the test data generator for generating a synthesized signal according to the test data when the test data is received; and a calibrating device coupled to the fractional-N phase-locked loop device for measuring power of the synthesized signal to generate a calibration signal utilized for adjusting the fractional-N phase-locked loop device.

16 Claims, 11 Drawing Sheets

SIGNAL GENERATING APPARATUS AND METHOD THEREOF

BACKGROUND

The present invention relates to a signal generating apparatus, and more particularly to a phase-locked loop based transmitter with a loop bandwidth compensation scheme, wherein the loop bandwidth compensation scheme calibrates a phase/frequency charge pump device according to a synthesized signal of a controllable oscillator of a signal generating apparatus, and a method thereof.

In general, phase locked loop (PLL) circuits are utilized for synthesizing a desired output signal having a frequency that is a multiple of a reference frequency from a source signal. The loop bandwidth of the PLL circuit is maintained as stably as possible within a predetermined range of output frequency of the PLL circuit. Please refer to FIG. 1. FIG. 1 is a related art Sigma-delta fractional N phase locked loop (PLL) transmitter 10. The Sigma-delta fractional N PLL transmitter 10 comprises a phase locked loop circuit 11, a Sigma-delta modulator 12, a channel selector 13, a Gaussian filter 14, and a compensation filter 15. The phase locked loop circuit 11 comprises a phase/frequency detector 11a, a charge pump circuit 11b, a loop filter 11c, a voltage-controlled oscillator 11d, and a divider 11e. Baseband data Sb is inputted to the Gaussian filter 14 to extract the required band of the Sigma-delta fractional N PLL transmitter 10. For example, if the transmitted signal of the Sigma-delta fractional N PLL transmitter 10 is a Gaussian Minimum Shift Keying (GMSK) signal $S_{GMSK}$, then the Gaussian filter 14 is a GMSK filter. Furthermore, as the frequency response of the phase locked loop circuit 11 acts like a low pass filter, the compensation filter 15 is utilized to compensate the baseband data Sb before it is modulated by the Sigma-delta modulator 12. The phase locked loop circuit 11 utilizes a reference frequency Sr to synthesize the required frequency to transmit the baseband data Sb. In a multi-band system, the phase locked loop circuit 11 needs to generate different frequency bands, and the channel selector 13 is utilized to select the required frequency band. Through the variation of the dividing number utilized by the divider 11e, the phase locked loop circuit 11 can generate different frequency bands accordingly. However, the loop bandwidth is sensitive to variations of parameters in the transfer function of the phase locked loop circuit 11. Therefore, an effective scheme to calibrate the loop bandwidth of the Sigma-delta fractional N phase locked loop (PLL) transmitter 10 is necessary. For the full description of related techniques, U.S. Pat. No. 6,724,265 B2 can be referred to.

SUMMARY OF THE INVENTION

One of the objectives of the present invention is to provide a phase-locked loop based transmitter with a loop bandwidth compensation scheme, wherein the loop bandwidth compensation scheme calibrates a phase/frequency charge pump device according to a synthesized signal of a controllable oscillator of the signal generating apparatus, and a method thereof.

According to an embodiment of the present invention, a signal generating apparatus is disclosed. The signal generating apparatus comprises a test data generator, a fractional-N phase-locked loop device, and a calibrating device. The test data generator generates a test data. The fractional-N phase-locked loop device is coupled to the test data generator for generating a synthesized signal according to the test data when it is received. The calibrating device is coupled to the fractional-N phase-locked loop device for measuring power of the synthesized signal to generate a calibration signal utilized for adjusting the fractional-N phase-locked loop device.

According to another embodiment of the present invention, a signal generating method disclosed. The signal generating method comprises the steps of: generating a test data; utilizing a fractional-N phase-locked loop device to generate a synthesized signal according to the test data when it is received; and measuring power of the synthesized signal to generate a calibration signal utilized for adjusting the fractional-N phase-locked loop device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
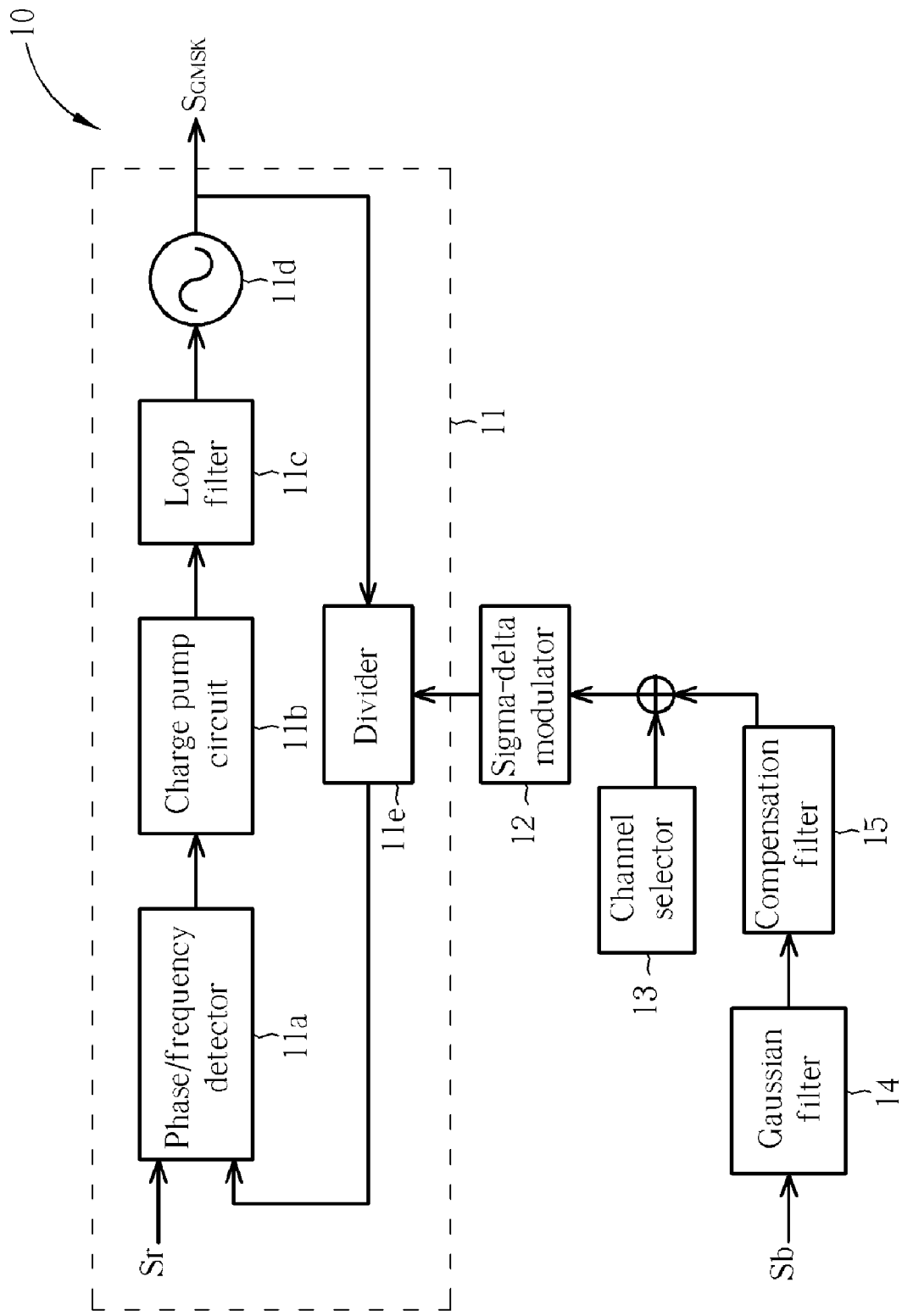
FIG. 1 is a related art Sigma-delta fractional N phase locked loop (PLL) transmitter.
Figure 2:
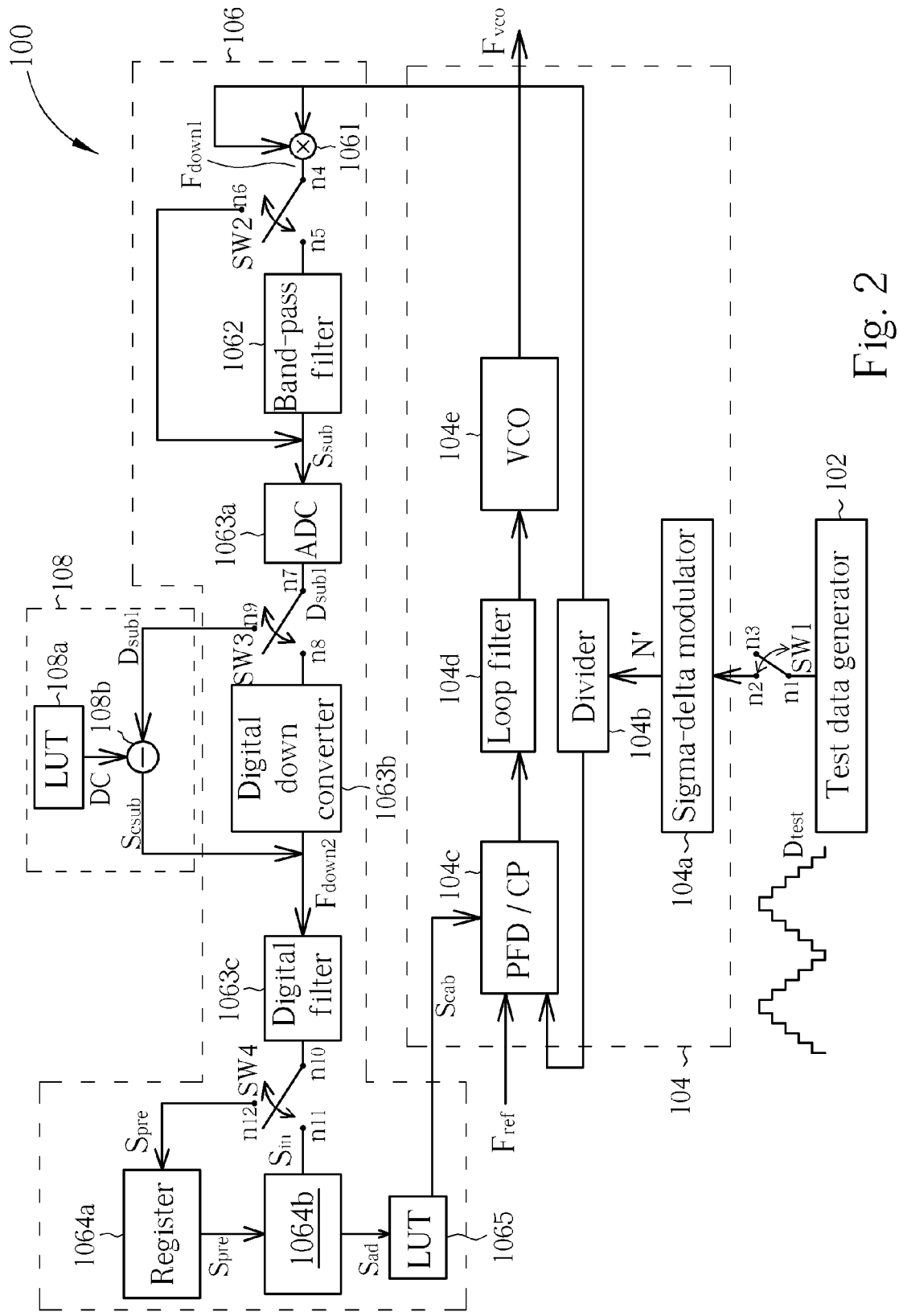
FIG. 2 is a diagram illustrating a signal generating apparatus according to a first embodiment of the present invention.

Please refer to FIG. 2. FIG. 2 is a diagram illustrating a signal generating apparatus 100 according to an embodiment of the present invention. The signal generating apparatus 100 comprises a test data generator 102, a fractional-N phase-locked loop device 104, and a calibrating device 106. Please note that those skilled in this art will readily understand that the signal generating apparatus 100 can be implemented as a fractional N PLL (Phase-locked loop) transmitter with a loop bandwidth calibration scheme. The test data generator 102 generates a test data $D_{test}$, and the fractional-N phase-locked loop device 104 is coupled to the test data generator 102 for generating a synthesized signal $F_{vco}$ according to the test data $D_{test}$ when it is received. The calibrating device 106 is coupled to the fractional-N phase-locked loop device 104 for measuring power (e.g. dBm) of the synthesized signal $F_{vco}$ to generate a calibration signal $S_{cab}$ utilized for adjusting a loop bandwidth BW of the fractional-N phase-locked loop device 104. The fractional-N phase-locked loop device 104 comprises a sigma-delta modulator 104a, a divider 104b, a phase/frequency charge pump device (PFD/CP) 104c, a loop filter 104d, and a voltage-controlled oscillator (VCO) 104e. The calibrating device 106 comprises a mixer 1061, a band-pass filter 1062, an analog-to-digital converter 1063a, a digital down converter 1063b, a digital filter 1063c, a register 1064a, a first operator 1064b, a first look-up table 1065, a second look-up table 108a, and a second operator 108b. The mixer 1061 is coupled to the voltage-controlled oscillator 104e for down converting the synthesized signal $F_{vco}$ according to the synthesized signal $F_{vco}$ to generate a first down-converted signal $F_{down1}$. The band-pass filter 1062 is coupled to the mixer 1061 for filtering the first down-converted signal $F_{down1}$ to output a sub-band signal $S_{sub}$ of the synthesized signal $F_{vco}$. The analog-to-digital converter 1063a is coupled to the band-pass filter 1062 for converting the sub-band signal $S_{sub}$ into a first digital sub-band signal $D_{sub1}$. The digital down converter 1063b is coupled to the analog-to-digital converter 1063a for down-converting the first digital sub-band signal $D_{sub1}$ into a second down-converted signal $F_{down2}$. The digital filter 1063c is coupled to the digital down converter 1063b for filtering the second down-converted signal $F_{down2}$ to generate an input signal $S_{in}$. The first operator 1064b is utilized for adjusting the input signal $S_{in}$ to generate an adjusted signal $S_{ad}$ according to a compensated data $S_{pre}$, in which the compensated data $S_{pre}$ is registered in the register 1064a. The first look-up table 1065 is coupled to the first operator 1064b to receive the adjusted signal $S_{ad}$, and to output the calibration signal $S_{cab}$ to the PFD/CP 104c accordingly.

Please note that, in order to obtain the compensated data $S_{pre}$, the signal generating apparatus 100 further comprises a first switching device SW1, a second switching device SW2, a third switching device SW3, and a fourth switching device SW4. The first switching device SW1 is coupled between the test data generator 102 and the sigma-delta modulator 104a, between the nodes $n_1$, $n_2$, and $n_3$. The second switching device SW2 is coupled between the mixer 1061 and the band-pass filter 1062, between the nodes $n_4$, $n_5$, and $n_6$. The third switching device SW3 is coupled between the ADC 1063a, the second operator 108b and the digital down converter 1063b, between the nodes $n_7$, $n_8$, and $n_9$. The fourth switching device SW4 is coupled between the digital filter 1063c, the register 1064a and the first operator 1064b, between the nodes $n_{10}$, $n_{11}$, and $n_{12}$. Please note that the detailed connectivity between each device is shown in FIG. 2. Furthermore, the DC offset calibration device 108, which comprises the second look-up table 108a and the second operator 108b, provides a DC offset calibration value DC, wherein before the test data is inputted to the fractional-N phase-locked loop device (i.e. the node $n_1$ coupled to the node $n_3$), the ADC 1063a further converts the first down-converted signal $F_{down1}$ to become a base band signal $D_{sub1}$, the DC offset calibration device 108 calibrates a DC level of the base band signal $D_{sub1}$ according to the DC offset calibration value DC to generate a calibrated base band signal $S_{csub}$, and the digital filter 1063c further filters the calibrated base band signal $S_{csub}$ to output the compensated data $S_{pre}$ to the register 1064a.

According to the embodiment of the present invention, the calibrating operation of the signal generating apparatus 100 comprises two steps. The first step is a DC offset calibration and the second step is a loop bandwidth calibration. In the loop bandwidth calibration, the signal generating apparatus 100 detects the synthesized signal $F_{vco}$ corresponding to the test data $D_{test}$ that is inputted to the sigma-delta modulator 104a. However, as the synthesized signal $F_{vco}$ comprises a carrier tone $S_{carrier}$ and test tones $S_{test}$, and the power of the test tones $S_{test}$ will be affected by the carrier tone $S_{carrier}$ in the process of extracting the test tones $S_{test}$, the DC offset calibration needs to proceed before the loop bandwidth calibration. In other words, the power of the carrier tone $S_{carrier}$ needs to be measured first before the DC offset calibration. Furthermore, it should be noted that the present invention is not limited to utilizing the DC offset calibration to avoid affecting the test tones $S_{test}$, and other methods such as setting the power of the carrier tone $S_{carrier}$ into 0 dBm can also obtain the same result as the utilization of the DC offset calibration.

Figure 3:
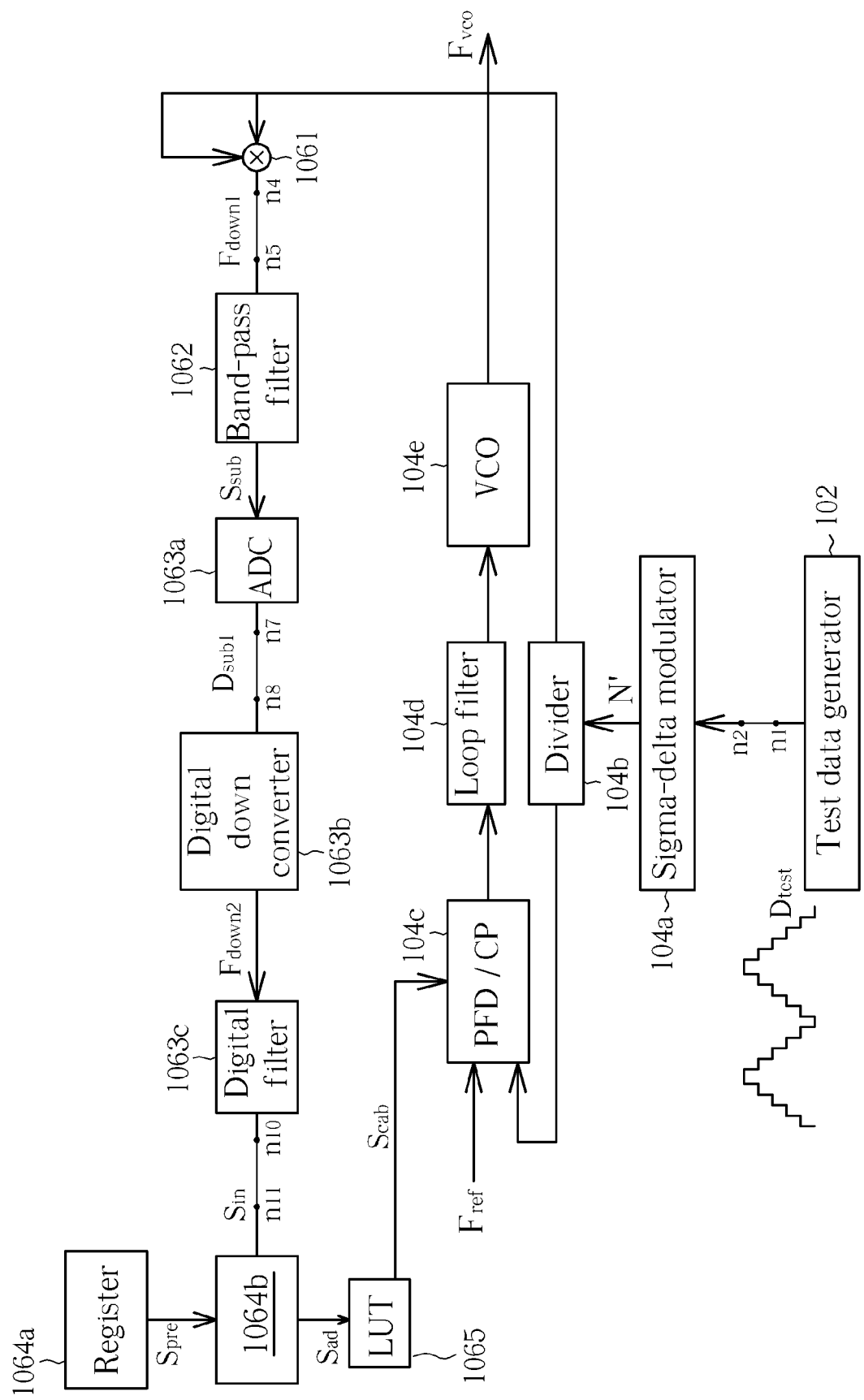
FIG. 3 is a diagram illustrating the signal generating apparatus of the first embodiment under the situation of loop bandwidth calibration.
Figure 4:
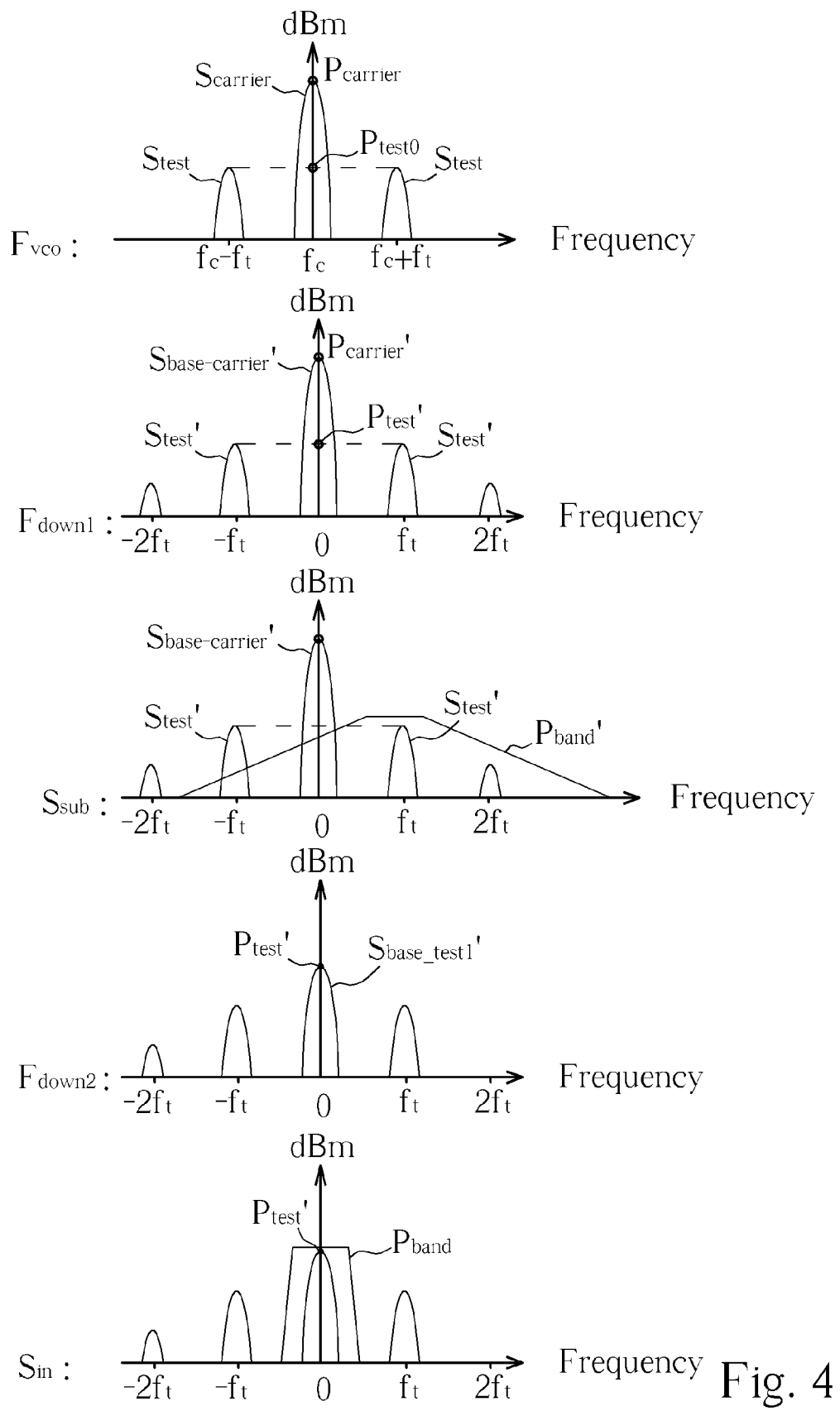
FIG. 4 is a frequency domain diagram illustrating the synthesized signal, the first down-converted signal, the sub-band signal, the second down-converted signal, and the input signal of the signal generating apparatus as shown in FIG. 3.
Figure 5:
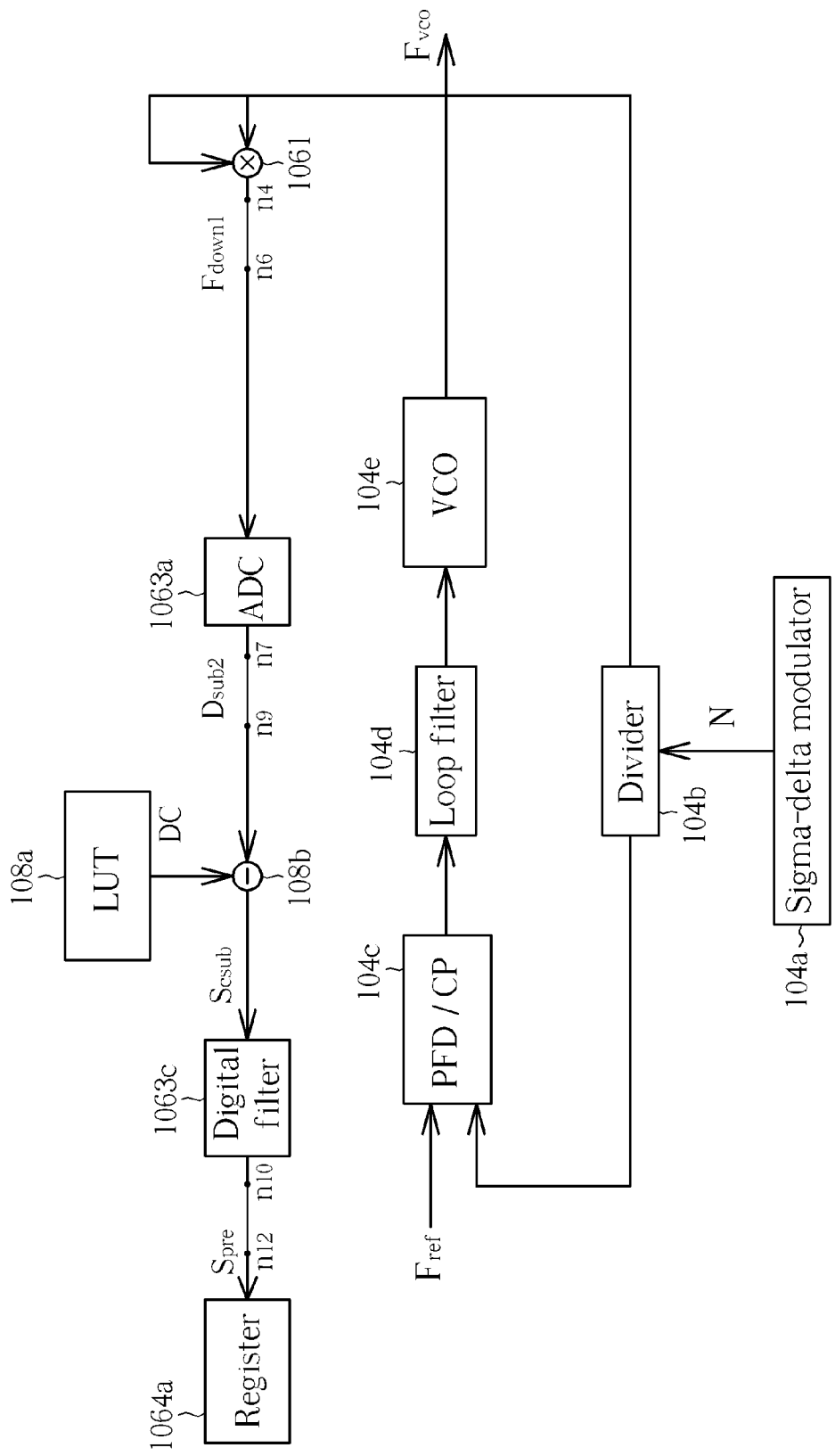
FIG. 5 is a diagram illustrating the signal generating apparatus of the first embodiment under the situation of DC offset calibration.
Figure 6:
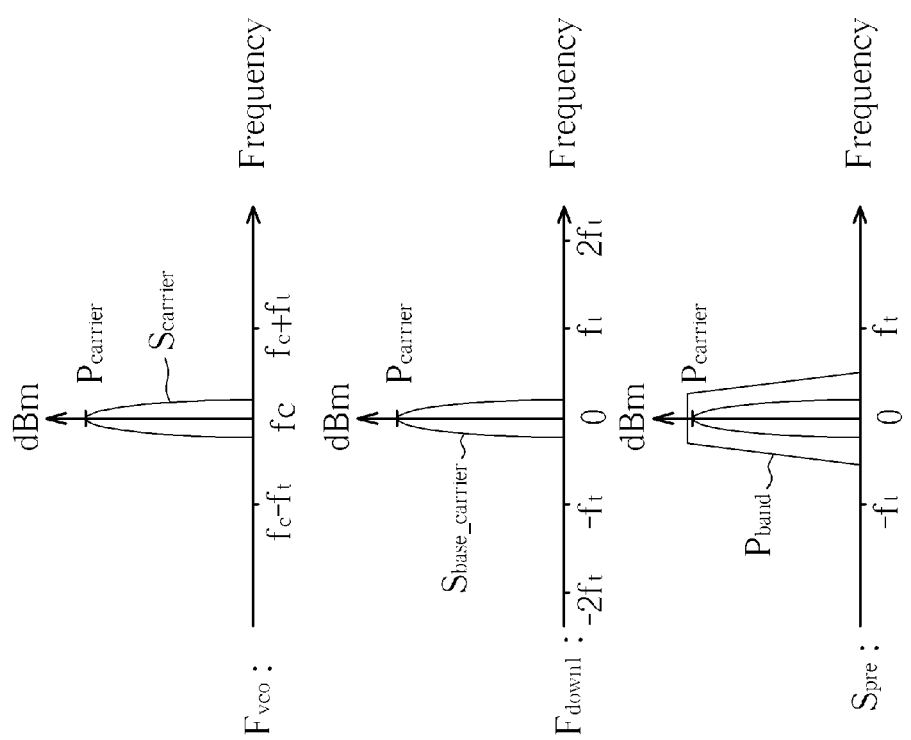
FIG. 6 is a frequency domain diagram illustrating the synthesized signal, the first down-converted signal, and the compensated data of the signal generating apparatus as shown in FIG. 5.

Please refer to FIG. 3, FIG. 4, FIG. 5, and FIG. 6. FIG. 3 is a diagram illustrating the signal generating apparatus 100 under the situation of loop bandwidth calibration. FIG. 4 is a frequency domain diagram illustrating the synthesized signal $F_{vco}$, the first down-converted signal $F_{down1}$, the sub-band signal $S_{sub}$, the second down-converted signal $F_{down2}$, and the input signal $S_{in}$ of the signal generating apparatus 100 as shown in FIG. 3. FIG. 5 is a diagram illustrating the signal generating apparatus 100 under the situation of the DC offset calibration. FIG. 6 is a frequency domain diagram illustrating the synthesized signal $F_{vco}$, the first down-converted signal $F_{down1}$, and the compensated data $S_{pre}$ of the signal generating apparatus 100 as shown in FIG. 5. Under the loop bandwidth calibration, the first switching device SW1 couples the node $n_1$ and node $n_2$; in other words, the test data $D_{test}$ is inputted to the sigma-delta modulator 104a. The second switching device SW2 couples the node $n_4$ and node $n_5$, the third switching device SW3 couples the node $n_7$ and node $n_8$, and the fourth switching device SW4 couples the node $n_{10}$ and node $n_{11}$ as shown in FIG. 3. Please note that, for brevity, the first switching device SW1, the second switching device SW2, the third switching device SW3, the fourth switching device SW4, and the DC offset calibration device 108 are not shown in FIG. 3. Under DC offset calibration, the first switching device SW1 opens the node $n_1$ and node $n_2$; in other words, the test data $D_{test}$ is not inputted to the sigma-delta modulator 104a. The second switching device SW2 couples the node $n_4$ and node $n_6$, the third switching device SW3 couples the node $n_7$ and node $n_9$, and the fourth switching device SW4 couples the node $n_{10}$ and node $n_{12}$ as shown in FIG. 5. Similarly, for brevity, the test data generator 102, the first switching device SW1, the second switching device SW2, the band-pass filter 1062, the third switching device SW3, the digital down converter 1063b, the fourth switching device SW4, the first operator 1064b, and the first look-up table 1065 are not shown in FIG. 5.

Please refer to FIG. 5 and FIG. 6 again. When the divider 104b receives a predetermined dividing factor N from the sigma-delta modulator 104a, the fractional-N phase-locked loop device 104 generates the carrier tone $S_{carrier}$ having a carrier frequency of $f_c$, in which the power of the carrier tone $S_{carrier}$ is $P_{carrier}$. The mixer 1061 down converts the carrier tone $S_{carrier}$ to become the first down-converted signal $F_{down1}$, which is a base band tone $S_{base\_carrier}$, and the power of the base band tone $S_{base\_carrier}$ is also $P_{carrier}$. The ADC 1063a converts the base band tone $S_{base\_carrier}$ from analog data into digital data in order to calibrate the DC offset of the carrier tone $S_{carrier}$ that is influenced by the mixer 1061 and the ADC 1063a. Accordingly, the second look-up table 108a outputs the DC offset calibration value DC to the second operator 108b to perform the DC offset calibration. Then, the calibrated base band signal $S_{csub}$ is inputted to the digital filter 1063c to generate the compensated data $S_{pre}$, in which the digital filter 1063c has a pass-band $P_{band}$ that is only adapted for the base band tone $S_{base\_carrier}$. In addition, the compensated data $S_{pre}$ also has the power $P_{carrier}$. Therefore, the power of the carrier tone $S_{carrier}$ of the fractional-N phase-locked loop device 104 can be registered in the register 1064a as $P_{carrier}$.

According to the loop bandwidth calibration of the signal generating apparatus 100 as shown in FIG. 3, the test data $D_{test}$ is inputted to the sigma-delta modulator 104a, and the sigma-delta modulator 104a outputs a dividing factor N' to the divider 104b. When the divider 104b receives the dividing factor N', the fractional-N phase-locked loop device 104 generates the synthesized signal $F_{vco}$, which comprises the carrier tone $S_{carrier}$ and the test tones $S_{test}$. The carrier tone $S_{carrier}$ has the carrier frequency of $f_c$, and the two test tones $S_{test}$ are located in the frequency ranges of $f_c-f_t$, $f_c+f_t$ respectively. Furthermore, the power of the carrier tone $S_{carrier}$ is also $P_{carrier}$, and the power of the test tones $S_{test}$ is $P_{test0}$. The mixer 1061 down converts the synthesized signal $F_{vco}$ to become the first down-converted signal $F_{down1}$, which comprises a base band tone $S_{base\_carrier}'$ and four sub-band tones $S_{test}'$ as shown in FIG. 4, wherein the power of the base band tone $S_{base\_carrier}'$ is $P_{carrier}'$ and the power of the first sub-band tone $S_{test}'$ is $P_{test}'$. Then, the band-pass filter 1062, which has a pass band $P_{band}'$, filters the first down-converted signal $F_{down1}$ for extracting the first sub-band tone $S_{test}'$ within the first down-converted signal $F_{down1}$. The ADC 1063a converts the output signal of the band-pass filter 1062 from analog data into digital data, and inputs the digital type data into the digital down converter 1063b. Therefore, the first sub-band tone $S_{test}'$ is down converted from the frequency $f_t$ into the base band to generate a base band test signal $S_{base\_test1}'$ (i.e. the second down-converted signal $F_{down2}$). The second down-converted signal $F_{down2}$ is then filtered by the digital filter 1063c. Similarly, the digital filter 1063c has the pass-band $P_{band}$ that is only adapted for the base band test signal $S_{base\_test1}'$ (i.e., the input signal $S_{in}$). Then, the first operator 1064b adjusts the base band test signal $S_{base\_test1}'$ to generate the adjusted signal $S_{ad}$ according to the compensated data $S_{pre}$. Please note that the present invention is not limited to utilizing the first operator 1064b to adjust the power $P_{test}'$ of the base band test signal $S_{base\_test1}'$, and any other method that can recover the power $P_{test0}$ from the power $P_{test}'$ belongs to the scope of the present invention. In addition, the adjusted signal $S_{ad}$ is inputted to the first look-up table 1065, and the first look-up table 1065 outputs the calibration signal $S_{cab}$ according to the adjusted signal $S_{ad}$ to adjust the loop bandwidth BW of the fractional-N phase-locked loop device 104. Those skilled in this art will readily understand the implementation of the loop bandwidth adjustment by utilizing the calibration signal $S_{cab}$, thus the detailed description is omitted here for brevity.

Figure 7:
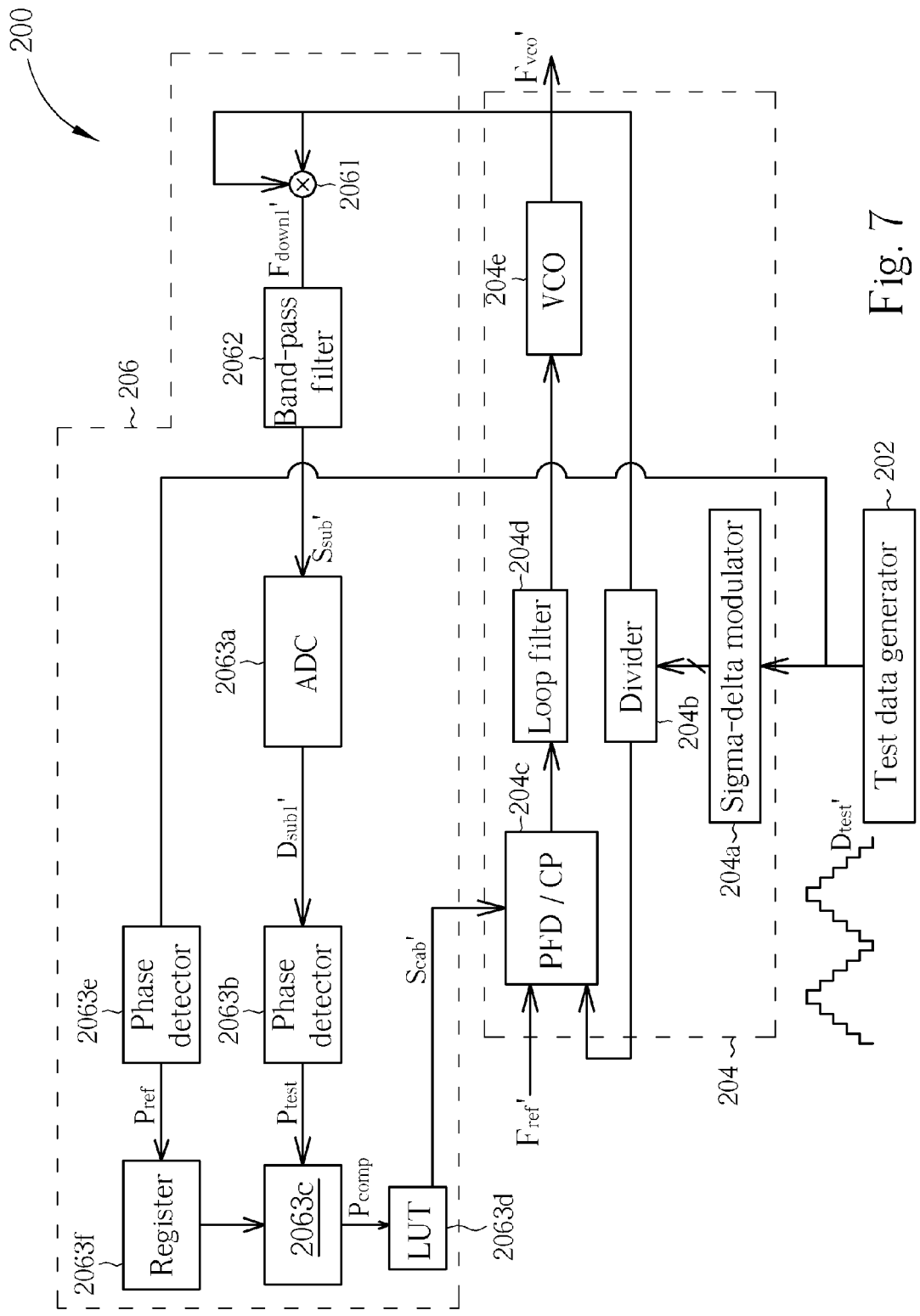
FIG. 7 is a diagram illustrating a signal generating apparatus according to a second embodiment of the present invention.
Figure 8:
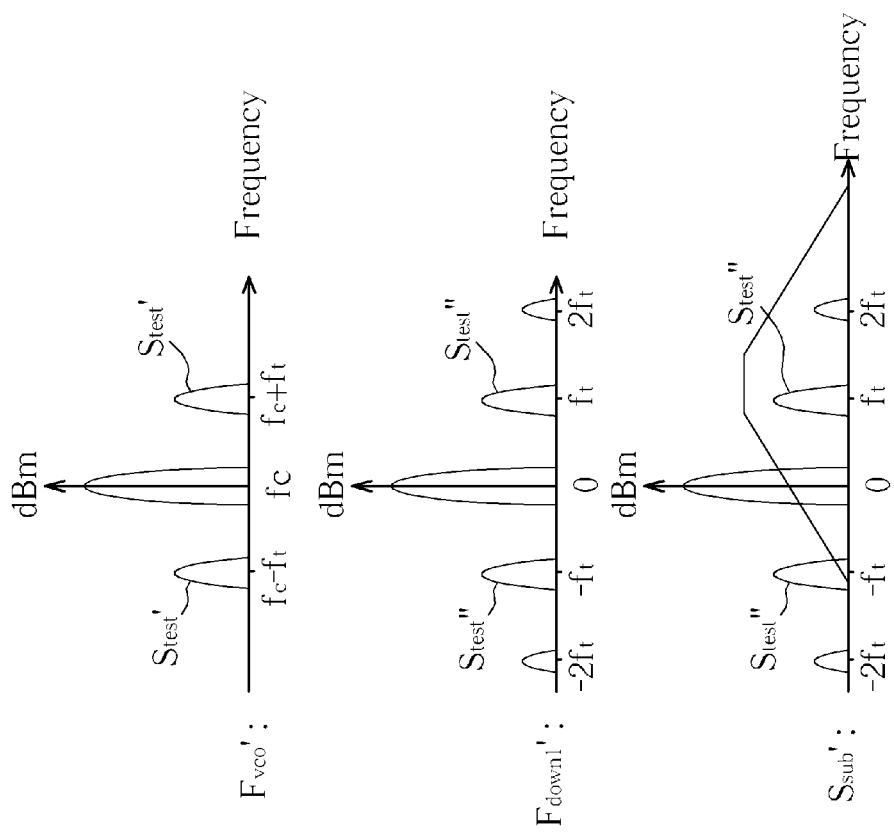
FIG. 8 is a frequency domain diagram illustrating the synthesized signal, the first down-converted signal, and the sub-band signal of the signal generating apparatus as shown in FIG. 7.

Please refer to FIG. 7 in conjunction with FIG. 8. FIG. 7 is a diagram illustrating a signal generating apparatus 200 according to a second embodiment of the present invention. FIG. 8 is a frequency domain diagram illustrating the synthesized signal $F_{vco}'$, the first down-converted signal $F_{down1}'$, and the sub-band signal $S_{sub}'$ of the signal generating apparatus 200 as shown in FIG. 7. The signal generating apparatus 200 comprises a test data generator 202, a fractional-N phase-locked loop device 204, and a calibrating device 206. Those skilled in this art will readily understand that the signal generating apparatus 200 can be implemented as a fractional N PLL (Phase-locked loop) transmitter with a loop bandwidth calibration scheme. The test data generator 202 generates a test data $D_{test}'$, and the fractional-N phase-locked loop device 204 is coupled to the test data generator 202 for generating a synthesized signal $F_{vco}'$ according to the test data $D_{test}'$ when received. The calibrating device 206 is coupled to the fractional-N phase-locked loop device 204 and the test data $D_{test}'$ for measuring power (e.g. dBm) of the synthesized signal $F_{vco}'$ to generate a calibration signal $S_{cab}'$ utilized for adjusting a loop bandwidth BW of the fractional-N phase-locked loop device 204. The fractional-N phase-locked loop device 204 comprises a sigma-delta modulator 204a, a divider 204b, a phase/frequency charge pump device (PFD/CP) 204c, a loop filter 204d, and a voltage-controlled oscillator (VCO) 204e. The calibrating device 206 comprises a mixer 2061, a band-pass filter 2062, an analog-to-digital converter 2063a, a first phase detector 2063b, an operator 2063c, a look-up table (LUT) 2063d, a second phase detector 2063e, and a register 2063f. Please note that the operator 2063c and the register 2063f can be viewed as a comparing unit that is utilized for comparing a first phase value $P_{ref}$ and a second phase value $P_{test}$ to generate a comparison result $P_{comp}$. Similar to the first embodiment, the mixer 2061 is coupled to the VCO 204e for down converting the synthesized signal $F_{vco}'$ according to the synthesized signal $F_{vco}'$ to generate a first down-converted signal $F_{down1}'$, which includes the test tones $S_{test}''$. The band-pass filter 2062 is coupled to the mixer 2061 for filtering the first down-converted signal $F_{down1}'$ to output a sub-band signal $S_{sub}'$ of the synthesized signal $F_{vco}'$ in order to extract the test tones $S_{test}''$. The ADC 2063a is coupled to the band-pass filter 2062 for converting the sub-band signal $S_{sub}'$ into a digital sub-band signal $D_{sub1}'$. The first phase detector 2063b is coupled to the ADC 2063a for detecting a phase of the digital sub-band signal $D_{sub1}'$ to generate the second phase value $P_{test}$ corresponding to the digital sub-band signal $D_{sub1}'$. The second phase detector 2063e is coupled to the test data generator 202 for detecting a phase of the test data $D_{test}'$ to generate the first phase value $P_{ref}$ corresponding to the test data $D_{test}'$. The register 2063f is utilized for registering the first phase value $P_{ref}$ in order to delay the first phase value $P_{ref}$ by a delay time, in which the delay time is equal to the path group delay that comprises the fractional-N phase-locked loop device 204, the mixer 2061, the band-pass filter 2062, the ADC 2063a, and the first phase detector 2063b. The operator 2063c compares the first phase value $P_{ref}$ and the second phase value $P_{test}$ to generate the comparison result $P_{comp}$. The look-up table 2063d is coupled to the operator 2063c for outputting the calibration signal $S_{cab}'$ according to the comparison result $P_{comp}$. Please note that, as the signal generating apparatus 200 is similar in part to the signal generating apparatus 100, therefore the following paragraph focuses on the operation of the first phase detector 2063b, the second phase detector 2063e, the operator 2063c, the register 2063f, and the look-up table (LUT) 2063d.

Figure 9:
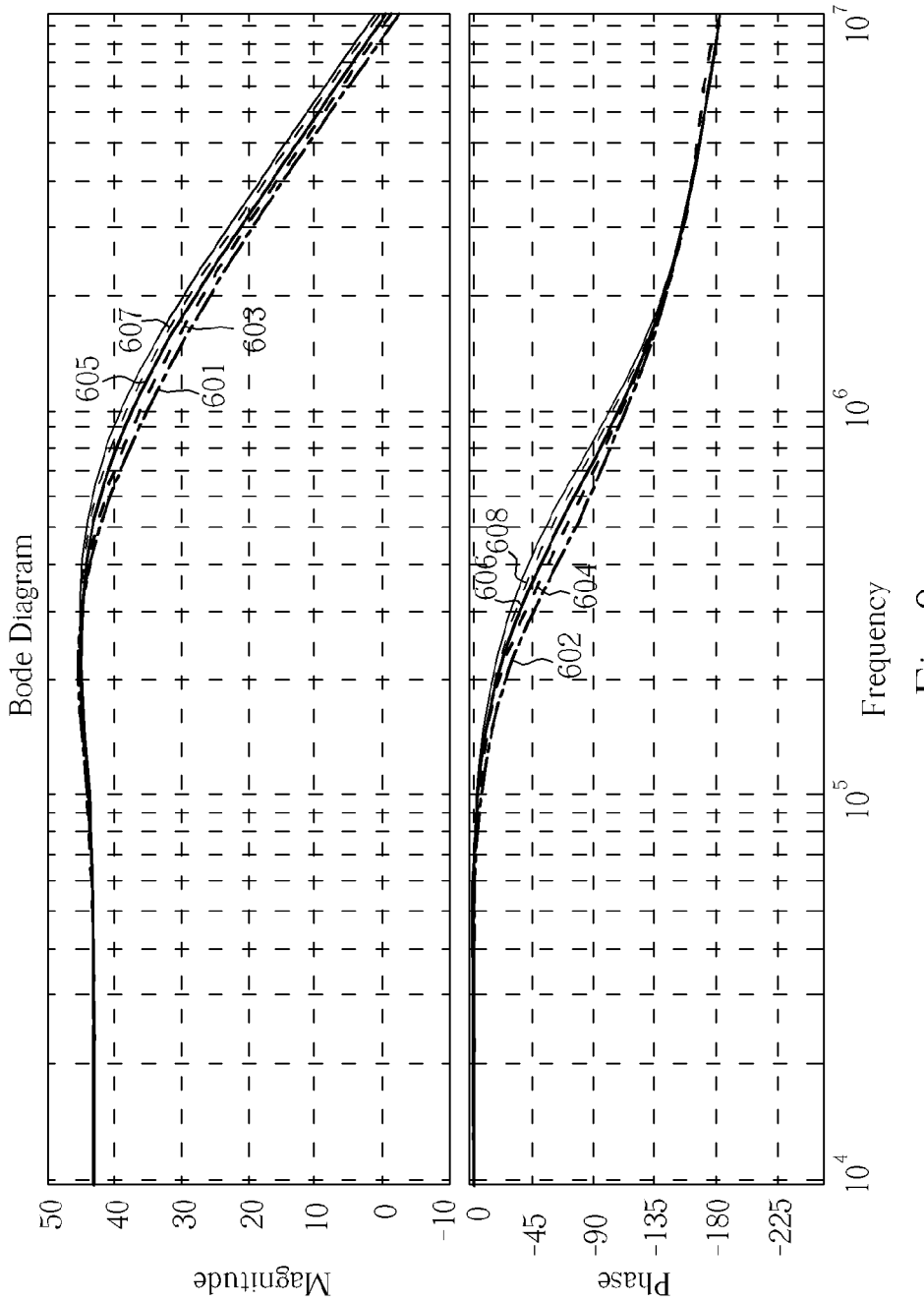
FIG. 9 is a bode plot illustrating the loop bandwidth variation of the transferring characteristic of the fractional-N phase-locked loop device of the signal generating apparatus of the second embodiment.

According to the second embodiment of the present invention, the look-up table 2063d stores a plurality of phase values that each correspond to a loop bandwidth BW of the fractional-N phase-locked loop device 204. Please refer to FIG. 9. FIG. 9 is a bode plot illustrating the variation of the loop bandwidth of the transferring characteristic of the fractional-N phase-locked loop device 204 of the signal generating apparatus 200. As known by those skilled in this art, the bode plot includes magnitude responses and phase responses with respect to frequencies. Therefore, when the loop bandwidth is varied, the respective phase is varied also as shown in FIG. 9, in which the magnitude response 601 corresponds to the phase responses 602, the magnitude response 603 corresponds to the phase responses 604, the magnitude response 605 corresponds to the phase responses 606, and the magnitude response 607 corresponds to the phase responses 608. The look-up table 2063d stores the relations between the phase responses and the magnitude responses in advance, thus the look-up table 2063d can determine the loop bandwidth of the fractional-N phase-locked loop device 204 according to the phase difference between the test data $D_{test}'$ and the test tones $S_{test}'$ that corresponds to the test data $D_{test}'$. Therefore, the second phase detector 2063e detects the phase of the test data $D_{test}'$, the first phase detector 2063b detects the phase of the test tones $S_{test}'$, and the operator 2063c calculates the phase difference between the first phase value $P_{ref}$ and the second phase value $P_{test}$. Please note that those skilled in this art will readily understand the determination of the loop bandwidth according to the phase difference between the test data $D_{test}'$ and the test tones $S_{test}'$, thus the detailed description is omitted here for brevity.

Figure 10:
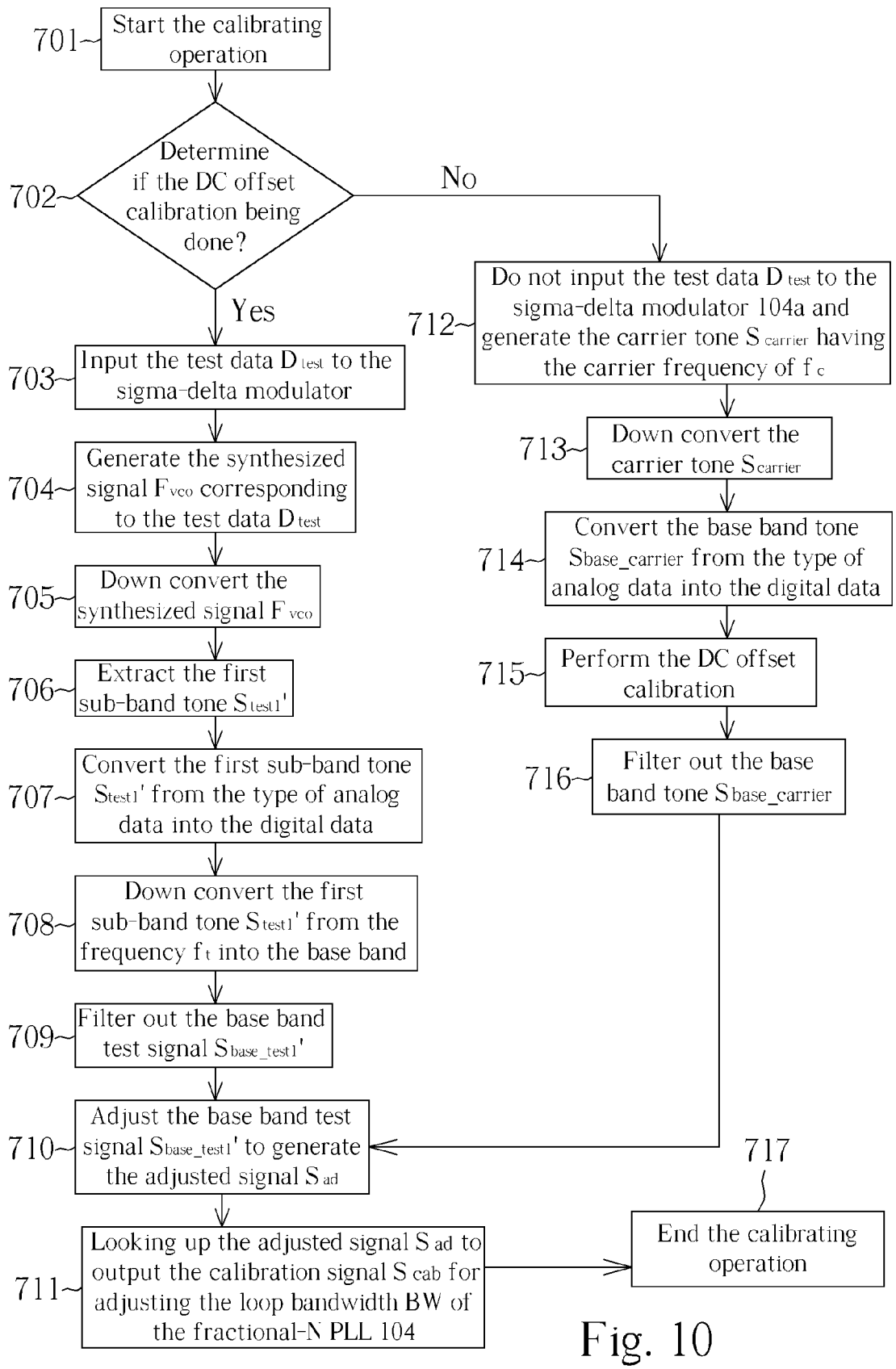
FIG. 10 is a flowchart illustrating a signal generating method employed by the signal generating apparatus as shown in FIG. 2.

Please refer to FIG. 10. FIG. 10 is a flowchart illustrating a signal generating method employed by the signal generating apparatus 100 as shown in FIG. 2. In other words, the signal generating method is described through the fractional N PLL (Phase-locked loop) transmitter with a loop bandwidth calibration scheme. The signal generating method comprises the following steps:

Step 701: Start the calibrating operation;
Step 702: Determine if the DC offset calibration is done? If yes go to step 703, if no go to step 712;
Step 703: Input the test data $D_{test}$ to the sigma-delta modulator 104a;
Step 704: Generate the synthesized signal $F_{vco}$ corresponding to the test data $D_{test}$, wherein the synthesized signal $F_{vco}$ comprises the carrier tone $S_{carrier}$ and the test tones $S_{test}$;
Step 705: Down convert the synthesized signal $F_{vco}$ to become the first down-converted signal $F_{down1}$, which comprises the base band tone $S_{base\_carrier}'$ and four sub-band tones $S_{test}'$;
Step 706: Extract the first sub-band tone $S_{test1}'$ within the first down-converted signal $F_{down1}$;
Step 707: Convert the first sub-band tone $S_{test1}'$ from analog data into digital data;
Step 708: Down convert the first sub-band tone $S_{test1}'$ from the frequency $f_t$ into the base band to generate the base band test signal $S_{base\_test1}'$;
Step 709: Filter out the base band test signal $S_{base\_test1}'$;
Step 710: Adjust the base band test signal $S_{base\_test1}'$ to generate the adjusted signal $S_{ad}$ according to the compensated data $S_{pre}$;
Step 711: Look up the adjusted signal $S_{ad}$ to output the calibration signal $S_{cab}$ for adjusting the loop bandwidth BW of the fractional-N phase-locked loop device 104, go to step 717;
Step 712: Do not input the test data $D_{test}$ to the sigma-delta modulator 104a, and generate the carrier tone $S_{carrier}$ having the carrier frequency of $f_c$;
Step 713: Down convert the carrier tone $S_{carrier}$ to become the first down-converted signal $F_{down1}$;
Step 714: Convert the base band tone $S_{base\_carrier}$ from analog data into digital data;
Step 715: Perform the DC offset calibration upon the base band tone $S_{base\_carrier}$;
Step 716: Filter out the base band tone $S_{base\_carrier}$ to generate the compensated data $S_{pre}$, go to step 710;
Step 717: End the calibrating operation.

Please note that the DC offset calibration of the signal generating apparatus 100 is performed in the steps 712~715, and the loop bandwidth calibration is performed in the steps 703~711.

Figure 11:
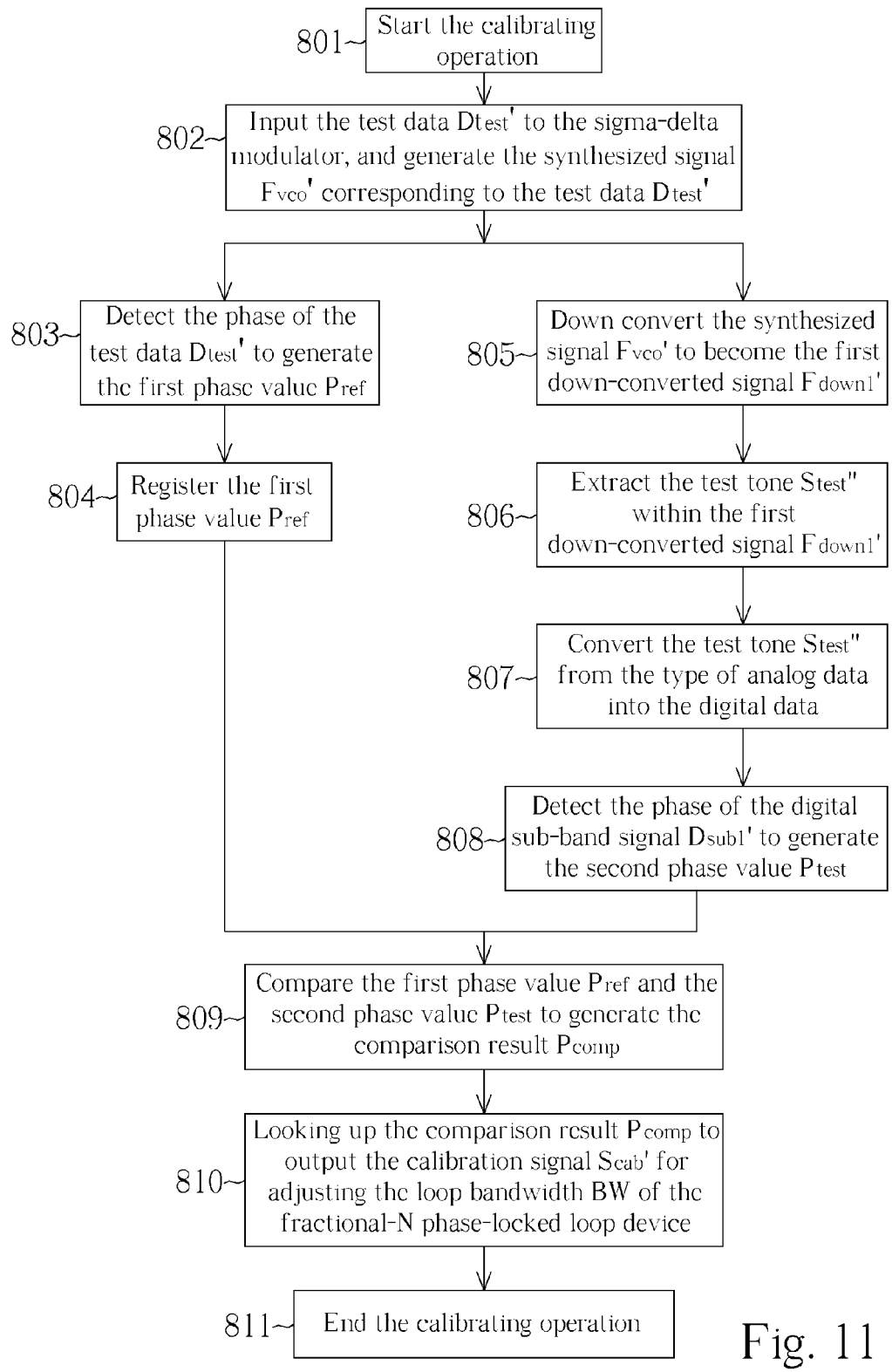
FIG. 11 is a flowchart illustrating another signal generating method employed by the signal generating apparatus as shown in FIG. 7.

Please refer to FIG. 11. FIG. 11 is a flowchart illustrating a signal generating method employed by the signal generating apparatus 200 as shown in FIG. 7. In other words, the signal generating method is described through the fractional N PLL (Phase-locked loop) transmitter with a loop bandwidth calibration scheme. The signal generating method comprises the following steps:

Step 801: Start the calibrating operation;
Step 802: Input the test data $D_{test}'$ to the sigma-delta modulator 204a, and generate the synthesized signal $F_{vco}'$ corresponding to the test data $D_{test}'$;
Step 803: Detect the phase of the test data $D_{test}'$ to generate the first phase value $P_{ref}$;
Step 804: Register the first phase value $P_{ref}$; go to step 809;
Step 805: Down convert the synthesized signal $F_{vco}'$ to become the first down-converted signal $F_{down1}'$;
Step 806: Extract the test tone $S_{test}''$ within the first down-converted signal $F_{down1}'$;
Step 807: Convert the test tone $S_{test}''$ from analog data into digital data;
Step 808: Detect the phase of the digital sub-band signal $D_{sub1}'$ to generate the second phase value $P_{test}$;
Step 809: Compare the first phase value $P_{ref}$ and the second phase value $P_{test}$ to generate the comparison result $P_{comp}$;
Step 810: Look up the comparison result $P_{comp}$ to output the calibration signal $S_{cab}'$ for adjusting the loop bandwidth BW of the fractional-N phase-locked loop device 204;
Step 811: End the calibrating operation.

In step 804, the first phase value $P_{ref}$ is delayed by a delay time, in which the delay time is equal to the path group delay that comprises the fractional-N phase-locked loop device 204, the mixer 2061, the band-pass filter 2062, the ADC 2063a, and the first phase detector 2063b of the signal generating apparatus 200. In step 809, the comparison result $P_{comp}$ is the phase difference between the test data $D_{test}'$ and the test tones $S_{test}'$ that corresponds to the test data $D_{test}'$.

Those skilled in the art will readily observe that numerous modifications and alterations of the device and method may be made while retaining the teachings of the invention.

What is claimed is:

1. A signal generating apparatus, comprising:
a test data generator, for generating a test data;
a fractional-N phase-locked loop device, coupled to the test data generator, for generating a synthesized signal according to the test data when the test data is received; and
a calibrating device, coupled to the fractional-N phase-locked loop device, for measuring power of the test data embedded in the synthesized signal and using a calibration signal indicative of a measured power to adjust the fractional-N phase-locked loop device.

2. The signal generating apparatus of claim 1, wherein the calibrating device comprises:
a mixer, coupled to the fractional-N phase-locked loop device, for down converting the synthesized signal according to the synthesized signal to generate a first down-converted signal;
a band-pass filter, coupled to the mixer, for filtering the first down-converted signal to output a sub-band signal; and
a calibrating module, coupled to the band-pass filter, for processing the sub-band signal to generate the calibration signal.

3. The signal generating apparatus of claim 2, wherein the calibrating module comprises:
an analog-to-digital converter, coupled to the band-pass filter, for converting the sub-band signal into a first digital sub-band signal;
a digital down converter, coupled to the analog-to-digital converter, for down-converting the first digital sub-band signal into a second down-converted signal;
a digital filter, coupled to the digital down converter, for filtering the second down-converted signal to generate an input signal; and
a computation circuit, coupled to the digital filter, for determining the calibration signal according to the input signal.

4. The signal generating apparatus of claim 3, wherein the computation circuit comprises:
a compensating unit, for compensating the input signal with a compensated value to generate a compensated signal; and
a first look-up table, coupled to the compensating unit, for outputting the calibration signal according to the compensated signal.

5. The signal generating apparatus of claim 4, further comprising:
a DC offset calibration device, coupled to the analog-to-digital converter, for providing a DC offset calibration value;
wherein before the test data is inputted to the fractional-N phase-locked loop device, the analog-to-digital converter further converts the first down-converted signal into a second digital sub-band signal, the DC offset calibration device calibrates a DC level of the second digital sub-band signal according to the DC offset calibration value to generate a calibrated sub-band signal, and the digital filter further filters the calibrated sub-band signal to output the compensated value to a register.

6. The signal generating apparatus of claim 5, wherein the DC offset calibration device is a second look-up table for outputting the DC offset calibration value according to a carrier frequency of the synthesized signal.

7. The signal generating apparatus of claim 2, wherein the calibrating module comprises:
an analog-to-digital converter, coupled to the band-pass filter, for converting the sub-band signal into a digital sub-band signal;
a first phase detector, coupled to the analog-to-digital converter, for detecting a phase of the digital sub-band signal to generate a second phase value corresponding to the digital sub-band signal;
a second phase detector, coupled to the test data generator, for detecting a phase of the test data to generate a first phase value corresponding to the test data; and
a computation circuit, coupled to the first phase detector and the second phase detector, for determining the calibration signal according to the first phase value and the second phase value.

8. The signal generating apparatus of claim 7, wherein the computation circuit comprises:
a comparing unit, for comparing the first phase value and the second phase value to generate a comparison result; and
a look-up table, coupled to the comparing unit, for outputting the calibration signal according to the comparison result.

9. A signal generating method, comprising:
(a) generating a test data;
(b) utilizing a fractional-N phase-locked loop device to generate a synthesized signal according to the test data when received; and
(c) measuring power of the test data embedded in the synthesized signal and using a calibration signal indicative of a measured power to adjust the fractional-N phase-locked loop device.

10. The signal generating method of claim 9, wherein the step (c) comprises:
(d) down converting the synthesized signal according to the synthesized signal to generated a first down-converted signal;
(e) filtering the first down-converted signal to output a sub-band signal; and
(f) processing the sub-band signal to generate the calibration signal.

11. The signal generating method of claim 10, wherein the step (f) comprises:
converting the sub-band signal into a first digital sub-band signal;
down-converting the first digital sub-band signal into a second down-converted signal;
filtering the second down-converted signal to generate an input signal; and
determining the calibration signal according to the input signal.

12. The signal generating method of claim 11, wherein the step of determining the calibration signal according to the input signal comprises:
compensating the input signal with a compensated value to generate a compensated signal; and
outputting the calibration signal according to the compensated signal.

13. The signal generating method of claim 12, further comprising:
providing a DC offset calibration value;
wherein before the test data is inputted to the fractional-N phase-locked loop device, the step of converting the sub-band signal into a first digital sub-band signal further converts the first down-converted signal into a second digital sub-band signal, the step of providing a DC offset calibration value calibrates a DC level of the second digital sub-band signal according to the DC offset calibration value to generate a calibrated sub-band signal, and the step of filtering the second down-converted signal to generate the input signal further filters the calibrated sub-band signal to output the compensated value to a register.

14. The signal generating method of claim 13, wherein the step of providing the DC offset calibration value comprises outputting the DC offset calibration value according to a carrier frequency of the synthesized signal.

15. The signal generating method of claim 10, wherein step (f) comprises:
converting the sub-band signal into a digital sub-band signal;
detecting a phase of the digital sub-band signal to generate a second phase value corresponding to the digital sub-band signal;
detecting a phase of the test data to generate a first phase value corresponding to the test data; and
determining the calibration signal according to the first phase value and the second phase value.

16. The signal generating method of claim 15, wherein the step of determining the calibration signal according to the first phase value and the second phase value comprises:
comparing the first phase value and the second phase value to generate a comparison result; and
outputting the calibration signal according to the comparison result.

* * * * *